US007098687B1

(12) United States Patent
Leventis et al.

(10) Patent No.: US 7,098,687 B1
(45) Date of Patent: Aug. 29, 2006

(54) FLEXIBLE ROUTING RESOURCES IN A PROGRAMMABLE LOGIC DEVICE

(75) Inventors: Paul Leventis, Toronto (CA); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 363 days.

(21) Appl. No.: 10/642,722

(22) Filed: Aug. 18, 2003

(51) Int. Cl.
*H03K 19/177* (2006.01)
(52) U.S. Cl. .......................... 326/41; 326/38
(58) Field of Classification Search .................. 326/41, 326/47
See application file for complete search history.

(56) References Cited

U.S. PATENT DOCUMENTS

| 5,717,346 A | * | 2/1998 | Gould et al. ................... 326/93 |
| 5,907,248 A | * | 5/1999 | Bauer et al. .................. 326/39 |
| 6,069,490 A | * | 5/2000 | Ochotta et al. ................ 326/41 |
| 6,362,650 B1 | * | 3/2002 | New et al. ..................... 326/41 |

* cited by examiner

*Primary Examiner*—Vibol Tan
(74) *Attorney, Agent, or Firm*—Beyer Weaver & Thomas LLP

(57) ABSTRACT

In particular aspects, embodiments of the present invention provide a programmable logic device including routing paths from one routing resource to another via connections between outputs of region input multiplexers and the destination routing resource and/or via connections between outputs of sub-region input multiplexers and the destination routing resource.

34 Claims, 4 Drawing Sheets

FLEXIBLE ROUTING RESOURCES IN A PROGRAMMABLE LOGIC DEVICE

BACKGROUND OF THE INVENTION

1. Field of the Invention

The present invention relates to routing in an electronic device, particularly with respect to programmable logic devices.

2. Description of Related Art

Programmable logic devices ("PLDs") (also sometimes referred to as CPLDs, PALs, PLAs, FPLAs, EPLDs, EEPLDs, LCAs, FPGAs, or by other names), are well-known integrated circuits that provide the advantages of fixed integrated circuits with the flexibility of custom integrated circuits. Such devices are well known in the art and typically provide an "off the shelf" device having at least a portion that can be programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to include such devices.

PLDs have configuration elements that may be programmed or reprogrammed. Configuration elements may be realized as RAM bits, flip-flops, EEPROM cells, or other memory elements. Placing new data into the configuration elements programs or reprograms the PLD's logic functions and associated routing pathways. Configuration elements that are field programmable are often implemented as RAM cells (sometimes referred to a "CRAM" or "configuration RAM"). However, many types of configurable elements may be used including static or dynamic random access memory, electrically erasable read-only memory, flash, fuse, and anti-fuse programmable connections. The programming of configuration elements could also be implemented through mask programming during fabrication of the device. While mask programming may have disadvantages relative to some of the field programmable options already listed, it may be useful in certain high volume applications.

PLDs typically include blocks of logic elements, sometimes referred to as logic array blocks ("LABs"; also referred to by other names, e.g., "configurable logic blocks," or "CLBs"). Logic elements ("LEs", also referred to by other names, e.g., "logic cells") may include a look-up table (LUT) or product term, carry-out chain, register, and other elements. LABs (comprising multiple LEs) may be connected to horizontal and vertical conductors ("H-lines" and "V-lines") that may or may not extend the length of the PLD's core.

As core density and complexity increases and as the volume of signals processed by a device grows, it is increasingly important to provide flexibility in core signal routing. A PLD core may include routing resources (e.g. H-lines and V-lines) having a variety of logical lengths (measured relative to logic regions spanned) for routing between logic regions (e.g. LABs) and for routing between core and I/O regions. However, in some instances, core routing lines that are relatively longer in length may be fewer in number than shorter length lines. Generally, in order to provide increased flexibility for routing onto the lines, the size of a multiplexer ("mux") or muxes feeding line drivers must be increased. However, if there is a desire to provide access to several additional resources (e.g. other routing resources trying to route onto the line), increasing the line's mux (or muxes) by one input for each additional resource can be detrimental both due to increased line loading and the increased space costs for a larger mux.

At the same time, muxes used to route signals into LABs (or other types of circuit regions) and into individual LEs (or other types of sub-regions) are not always fully utilized. These muxes provide a potential resource whose excess flexibility may be utilized to provide increased flexibility for routing onto particular lines without unduly increasing the size of those muxes that directly feed the particular line.

Thus there is both a need and an opportunity to provide routing connections that increase the number of resources that can access a particular routing line without unduly increasing the size of the mux feeding that line.

SUMMARY OF THE INVENTION

One embodiment of the invention provides a programmable logic device including routing paths from one routing resource to another via connections between outputs of logic region input muxes and muxes of the destination routing resource. In an aspect of this embodiment, the destination routing resource may be a core routing resource that is longer than other similarly oriented core routing resources. In another aspect, such routing paths may be included for destination routing resources of the same orientation such as, for example, horizontal or vertical core routing lines. In another aspect, such routing paths may be included for destination routing resources of varying orientation such as, for example, horizontal and vertical core routing lines.

Another embodiment of the invention provides a programmable logic device including routing paths from one routing resource to another via connections between outputs of logic element input multiplexers and multiplexers of the destination routing resource. In an aspect of this embodiment, the logic element input multiplexers coupled to a destination routing resource may include multiplexers that feed secondary signal logic.

In other embodiments, connections from input multiplexers of other types of circuit regions (e.g. dedicated blocks) or from input multiplexers of other types of sub-regions are used to provide increased routing flexibility.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION OF THE EXEMPLARY EMBODIMENTS

The following description is presented to enable a person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

For ease of description, embodiments of the present invention are described primarily with reference to the example of logic array blocks ("LABs") (a type of circuit region) and associated logic array block input multiplexers ("LIMs") and with respect to logic elements ("LEs") (a type of circuit sub-region, in this example, a sub-region of a LAB) and associated logic element input multiplexers ("LE-IMs"). However, the invention is equally applicable in the context of other types of circuit regions and associated region input multiplexers and other types of sub-regions and associated sub-region input multiplexers. For example, other types of regions may include dedicated blocks, which in general refer to blocks of circuitry in a PLD that may be programmable, but nevertheless may be more specialized than LABs. Examples of dedicated blocks include RAM or MRAM blocks, multiply accumulator ("MAC") blocks, digital signal processing ("DSP") block or other types of blocks that are more specialized than logic array blocks. These other types of blocks may be fed by region input multiplexers and may have sub-regions and/or individual elements that are in turn fed by sub-region input multiplexers. Such input multiplexers for such other types of circuit regions and sub-regions may also be utilized to provide added routing flexibility between routing resources consistent with the principles of the present invention.

Figure 1:
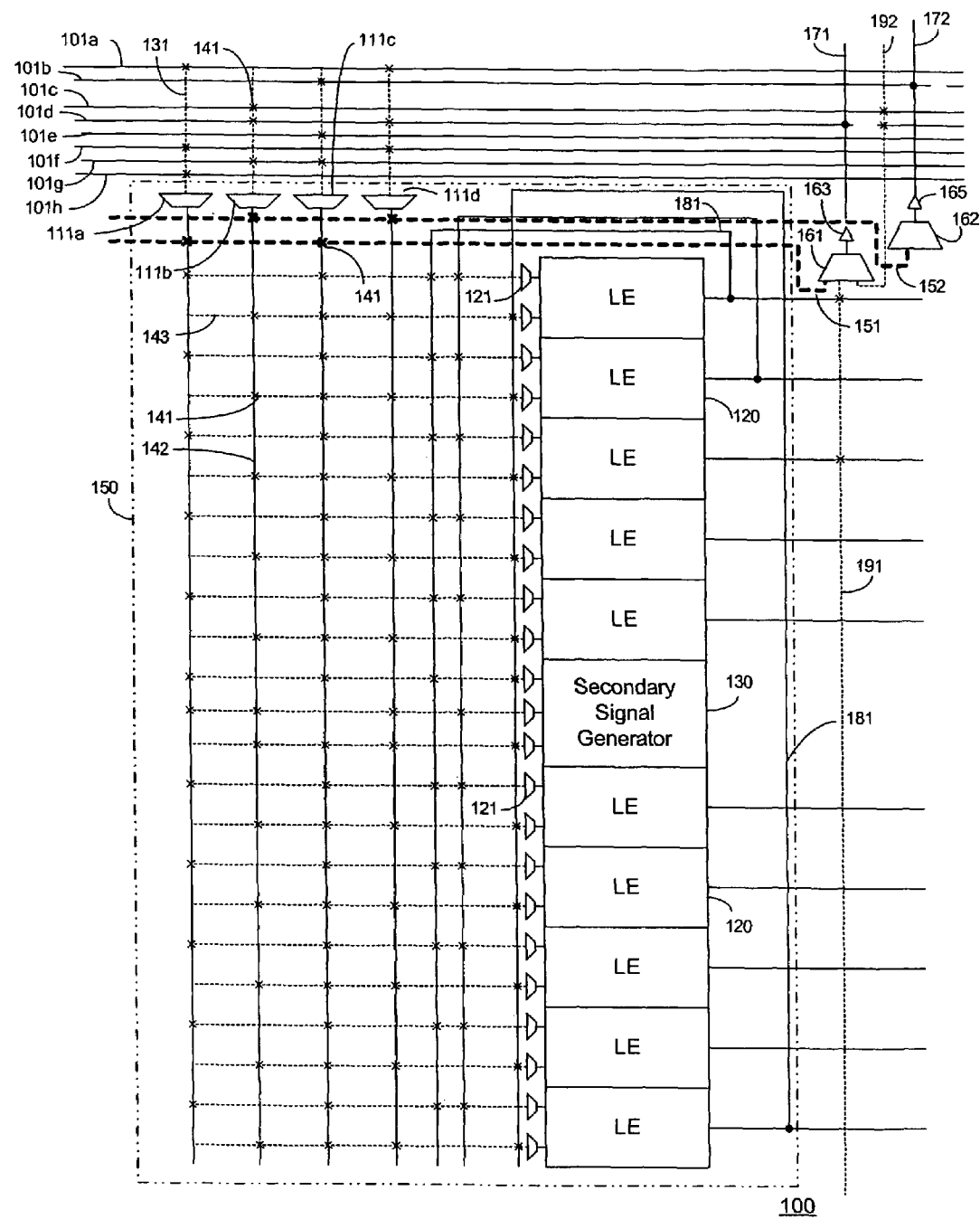
FIG. 1 illustrates a logic region portion and routing resources of a PLD in including connections between outputs of logic region input multiplexers and input multiplexers of a destination routing resource in accordance with a first embodiment of the present invention.

FIG. 1 illustrates a logic region portion of a PLD 100 including routing connections in accordance with a first embodiment of the present invention. PLD 100 comprises logic regions in the form of logic array blocks such as logic array block ("LAB") 150. LAB 150 includes logic elements ("LEs") 120 and secondary signal generator 130. Inputs of LEs 120 and secondary signal generator 130 are coupled to receive signals through logic element input muxes ("LE-IMs") 121. LEIMs 121 are coupled to receive signals through LAB input muxes ("LIMs") 111*a*, 111*b*, 111*c*, and 111*d* (collectively "LIMs 111") via LAB lines 142, connections 141, and lines 143. Some LEIMs are also coupled to receive signals from outputs of LEs 120 via local lines 181 and connections 141 as shown. LIMs 111 are coupled to routing resources 101*a*, 101*b*, 101*c*, 101*d*, 101*e*, 101*f*, 101*g*, and 101*h* (collectively "routing resources 101") via connections 141 and lines 131. Connections 141 in the illustrated embodiment are programmable but may be non-programmable in other embodiments without necessarily departing from the spirit and scope of the present invention. In general, the term "LIM" as used herein is simply a label referring to a selector feeding a logic region and the term "LEIM" as used herein is simply a label referring to a selector feeding an element within a logic region (e.g., an LE or a secondary signal generator).

Routing resources 101 include routing lines that are used to route signals between various core logic regions of PLD 100 and/or between PLD 100's core and I/O regions (other core logic regions and I/O regions and not separately shown). Such routing lines may include horizontal lines ("H-lines") and vertical lines ("V-lines") or other lines. A first routing line 101*d* of the illustrated routing lines is coupled to receive signals driven by driver 163 which in turn is coupled to receive a selected signal for driving the routing line from a first driver input mux ("DIM") 161. A second routing line 101*b* of the illustrated routing lines is coupled to receive signals driven by driver 165 which in turn is coupled to receive a selected signal for driving the routing line from a second DIM 162. In general, the term "DIM" as used herein is simply a label referring to a selector feeding a routing resource.

First DIM 161 is coupled to receive signals via lines 191 and lines 192 through connections 141. Lines 191 are coupled to outputs of two LEs 120 as shown and lines 192 are coupled to receive signals from routing resources 101*c* and 101*d*. First DIM 161 is also coupled to receive signals from the outputs of LIMs 111*a* and 111*c* via first connection lines 151 and connections 141 as shown.

The coupling between the outputs of LIMs 111*a* and 111*c* and DIM 161 provides routing options from routing resources 101*a*, 101*b*, 101*e*, 101*f*, 101*g*, and 101*h* to routing resource 101*d* via LIMs 111*a* and 111*c*, connections 141 and connection lines 151, and DIM 161. Routing resource 101*d* may be labeled in this context as a "destination" resource simply to indicate that some of the connections shown and described relate to paths from other routing resources 101 to resource 101*d*. In this particular example, routing resource 101*d* is a "long" H-line in that it has a logical length (measured relative to logic regions—e.g., LABs—spanned) that is longer than that of some of the other routing resources of PLD 100.

Second DIM 162, which feeds routing another destination resource 101*b*, is coupled to receive signals from the outputs of LIMs 111*b* and 11*d* via second connection lines 152 and connections 141 as shown. The coupling between the outputs of LIMs 111*b* and 111*d* and DIM 162 provides routing options from routing resources 101*a*, 101*c*, 101*d*, 101*e*, and 101*f* to routing resource 101*b* via LIMs 111*b* and 111*d*, connections 141 and connection lines 152, and DIM 162. In this particular example, routing resource 101*b* is a V-line that, like routing resource 101*d*, may described as "long." Even though routing resources 101 include H-lines (like resource 101*d*) and V-lines (like resource 101*b*), they are all illustrated horizontally so that they can be represented together without overcomplicating the drawings.

Figure 2A:
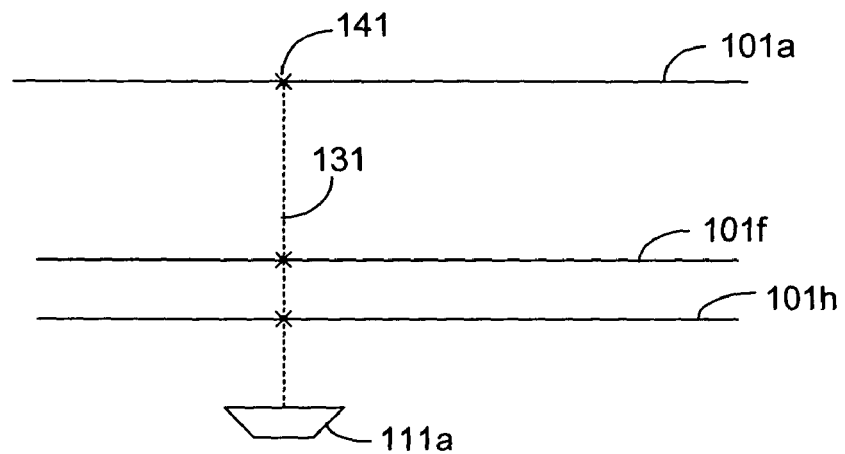
FIG. 2 illustrates the notation used for connections to multiplexer inputs in FIG. 1 and FIG. 3 by way of an example connection from the embodiment of FIG. 1.
Figure 2B:
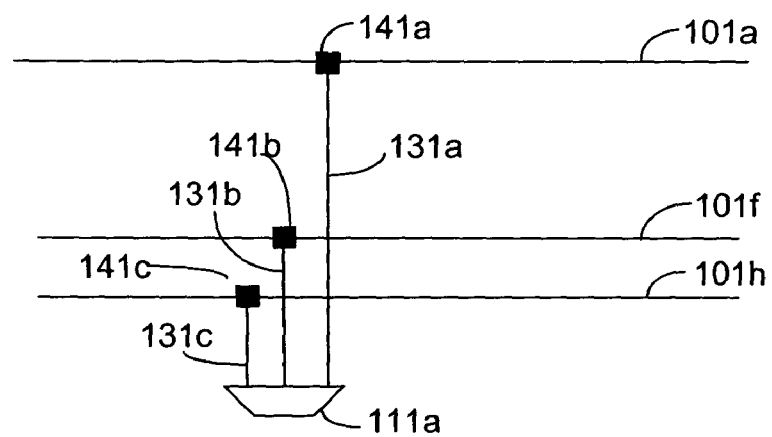
Figure 3:
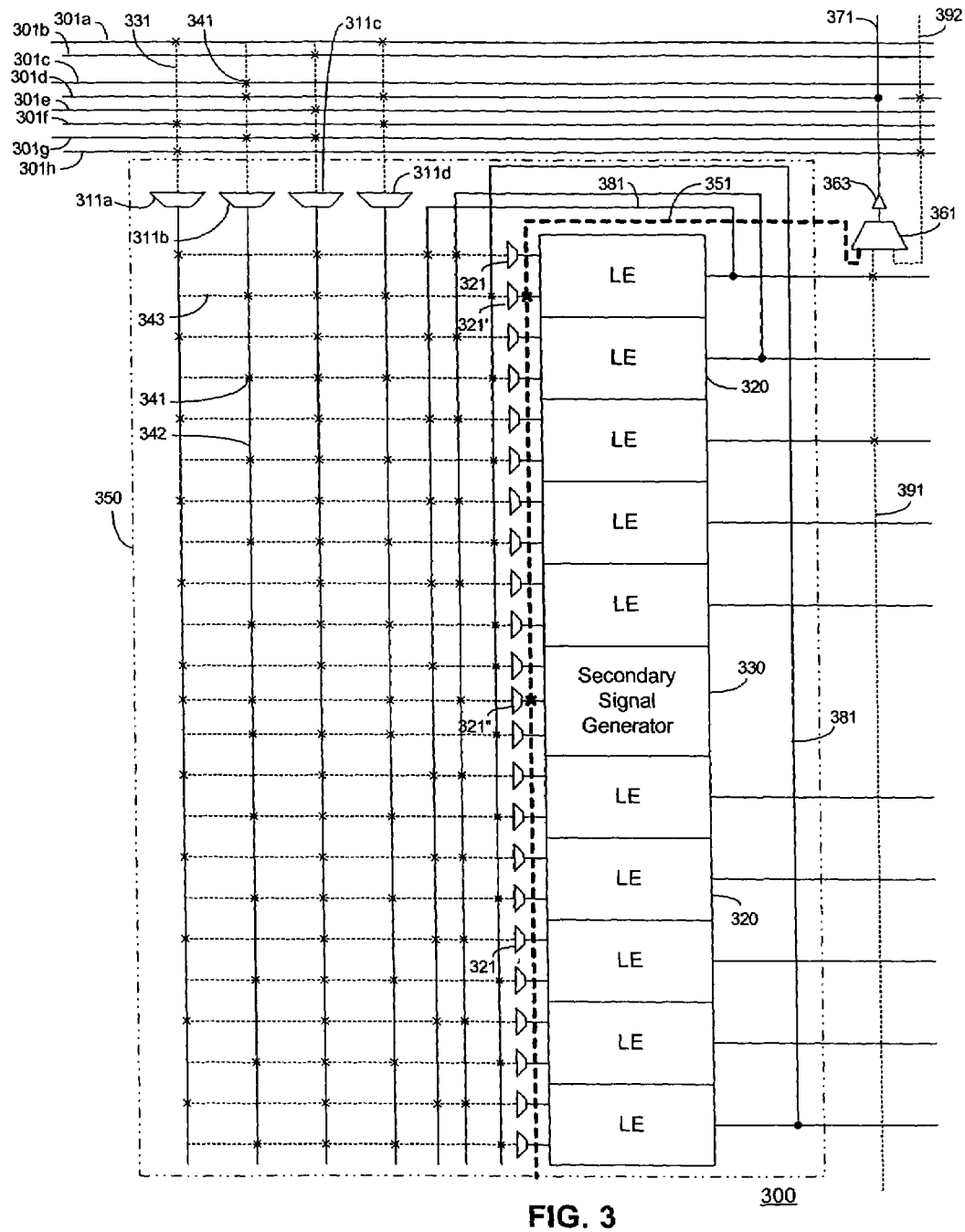
FIG. 3 illustrate a logic region portion and routing resources of a PLD including connections between outputs of logic element input multiplexers and input multiplexers of a destination routing resource in accordance with a second embodiment of the present invention.

FIGS. 2*a*–2*b* illustrate by way of example the notation used to represent mux coupling in FIG. 1 and FIG. 3. FIG. 2*a* shows the coupling of routing resources 101*a*, 101*f*, and 101*h* to DIM 111*a* via lines 131 and connections 141 as illustrated in FIG. 1. Lines 131 are represented as a single dotted line to indicate that it is comprised of lines for each connection 141. FIG. 2*b* illustrates the equivalent connections to those represented in FIG. 2*a*. As shown in FIG. 2*b*, lines 131 comprise lines 131*a*, 131*b*, and 131*c* coupled to DIM 111*a* through, respectively connections 141*a*, 141*b*, and 141*c* as shown. This notation also applies to, referring by way of example to FIG. 1, lines 143 coupled to LEIMs 121, lines 191 and lines 192 coupled to DIM 161, and lines 151 and lines 152 coupled to, respectively, DIMs 161 and 162.

FIG. 3 illustrates a logic region portion of a PLD 300 including routing connections in accordance with a second embodiment of the present invention. The embodiment of FIG. 3 may be contrasted to the embodiment of FIG. 1 in that the FIG. 3 embodiment illustrates connections from LEIM outputs (rather than LIM outputs) to DIMs to provide increased routing flexibility.

Referring to FIG. 3, PLD 300 comprises logic regions in the form of logic array blocks such as LAB 350. LAB 350 includes logic elements LEs 320 and secondary signal generator 330. Inputs of LEs 320 and secondary signal generator 330 are coupled to receive signals through LEIMs 321. LEIMs 321 are coupled to receive signals through LIMs 311a, 311b, 311c, and 311d (collectively "LIMs 311") via LAB lines 342, connections 341, and lines 343. Some LEIMs 321 are also coupled to receive signals from outputs of LEs 320 via local lines 381 and connections 341 as shown. LIMs 311 are coupled to routing resources 301a, 301b, 301c, 301d, 301e, 301f, 301g, and 301h (collectively "routing resources 301") via connections 341 and lines 331. Connections 341 in the illustrated embodiment are programmable but may be non-programmable in other embodiments without necessarily departing from the spirit and scope of the present invention.

Like routing resources 101 in FIG. 1, routing resources 301 in FIG. 3 include routing lines that are used to route signals between various core logic regions of PLD 300 and/or between PLD 300's core and I/O regions (other core logic regions and I/O regions not separately shown). Such routing lines may include H-lines and V-lines or other lines. A routing line 301d of the illustrated routing lines is coupled to receive signals driven by driver 363 which in turn is coupled to receive a selected signal for driving the routing line from a DIM 361.

DIM 361 is coupled to receive signals via lines 391 and lines 392 through connections 341. Lines 391 are coupled to outputs of two LEs 320 as shown and lines 392 are coupled to receive signals from routing resources 301e and 301h. DIM 361 is also coupled to receive signals from the outputs of LEIMs 321' and 321" via connection lines 351 and connections 341 as shown.

The coupling between the outputs of LEIMs 321' and 321" and DIM 361 provides routing options from illustrated routing resources 301a, 301b, 301c, 301e, 301f, 301g, and 301h to routing resource 301d via LIMs 311, LEIMs 321' and 321", connections 341 and connection lines 351, and DIM 361. In this particular example, routing resource 301d is a "long" H-line in that it has a logical length that is longer than some of the other routing resources of PLD 300. Thus, as previously explained, it is desirable to provide the additional routing options from other routing resources 301 to the resource 301d afforded by the illustrated connections.

LEIM 321" is an input to secondary signal generator 330. Secondary signal generator 330 provides certain signals within LAB 350 (e.g. certain clock and control signals) over lines local to LAB 350 (local routing lines for these signals not separately shown). In some applications, LEIMs such as LEIM 321" that feed secondary signal generator 330 are used less often in than are LEIMs that feed LEs 320. Thus, it may be particularly desirable to tap outputs of LEIMs that feed a secondary signal generator to provide optional routes to DIMs such as DIM 361.

In other alternative embodiments, the routing connections highlighted in FIG. 1 (between LIM outputs and DIM inputs) and the routing connections highlighted in FIG. 3 (between LEIM outputs and DIM inputs) may be combined (i.e. both exist) in the same logic regions and associated routing structures.

Although the embodiment illustrated in FIG. 3 shows an example in the context of an architecture including routing from routing resources to individual logic elements through both LIMs and LEIMs, the principles of the present invention may also be applied to architectures in which routing occurs from routing resources to logic elements more directly, e.g., through LEIMs without the presence of LIMs.

Figure 4:
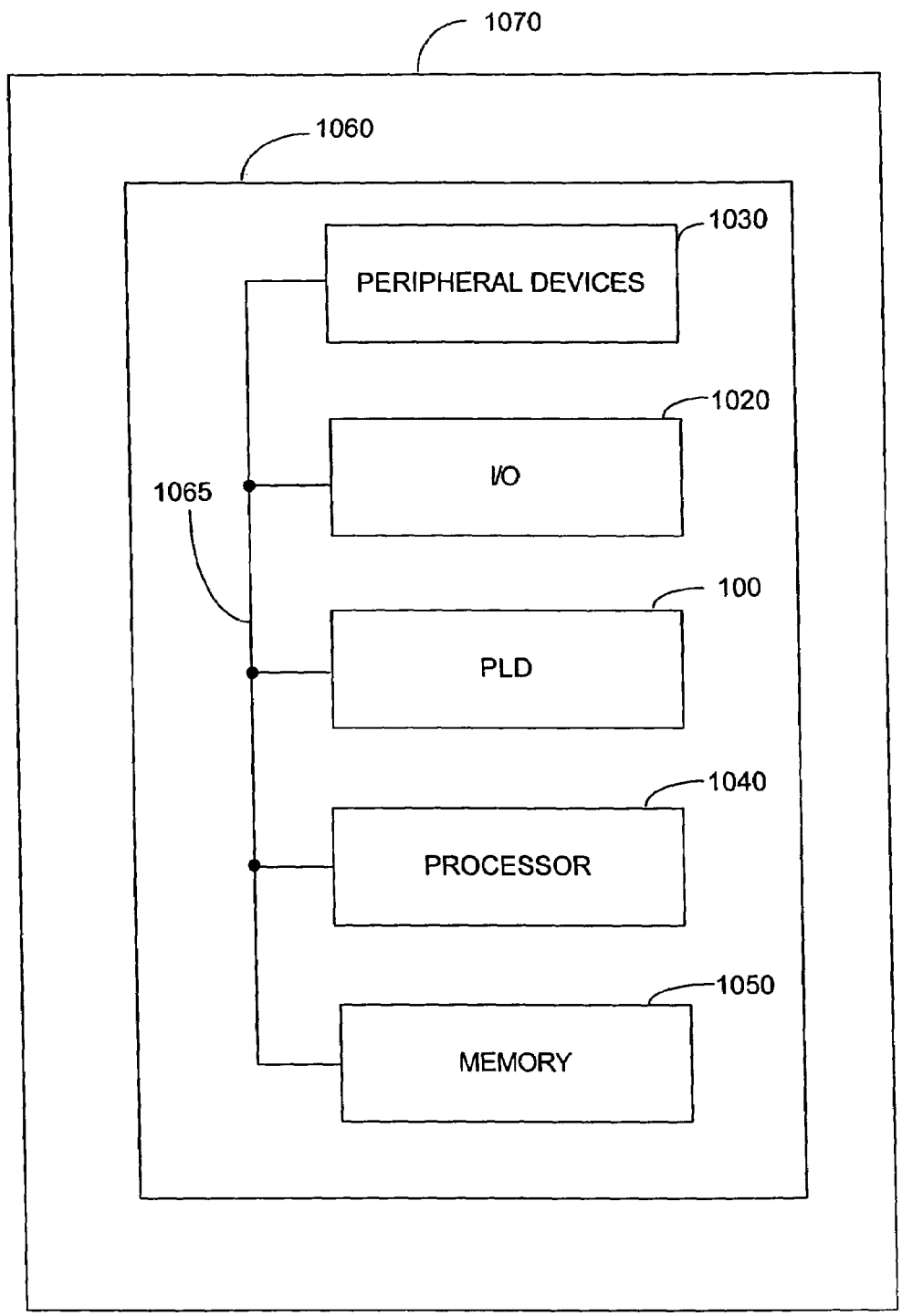
FIG. 4 illustrates an exemplary data processing system in which a PLD in accordance with the present invention may be implemented.

FIG. 4 illustrates, by way of example, PLD 100 in a data processing system 1000. Data processing system 1000 may include one or more of the following components: a processor 1040; memory 1050; I//O circuitry 1020; and peripheral devices 1030. These components are coupled together by a system bus 1065 and are populated on a circuit board 1060 which is contained in an end-user system 1070. A data processing system such as system 1000 may include a single end-user system such as end-user system 1070 or may include a plurality of systems working together as a data processing system.

System 1000 can be used in a wide variety of applications, such as computer networking, data networking, instrumentation, video processing, digital signal processing, or any other application where the advantage of using programmable or reprogrammable logic is desirable. PLD 100 can be used to perform a variety of different logic functions. For example, programmable logic device 100 can be configured as a processor or controller that works in cooperation with processor 1040 (or, in alterative embodiments, a PLD might itself act as the sole system processor). PLD 100 may also be used as an arbiter for arbitrating access to a shared resources in system 1000. In yet another example, PLD 100 can be configured as an interface between processor 1040 and one of the other components in system 1000. It should be noted that system 1000 is only exemplary.

Although particular embodiments have been described in detail, various modifications to the embodiments described herein may be made without departing from the spirit and scope of the present invention, thus, the invention is limited only by the appended claims.

What is claimed is:

1. A programmable logic device comprising:
   circuit regions including region input multiplexers to select signals for routing to the circuit regions;
   routing resources including routing resources coupled to the region input multiplexers and including a first routing line coupled to route signals between the circuit regions, the first routing line including a first driver input multiplexer ("DIM") to select signals for driving the first routing line; and
   one or more connection lines coupling respective outputs of one or more of the region input multiplexers to the first DIM,
   wherein the routing resources also include a second routing line coupled to route signals between the circuit regions, the second routing line including a second driver input multiplexer ("DIM") to select signals for driving the second routing line; and
   the programmable logic device further comprises one or more connection lines coupling respective outputs of one or more of the region input multiplexers to the second DIM.

2. The programmable logic device of claim 1 wherein the first routing line is a longer line than at least some of the other routing resources.

3. The programmable logic device of claim 1 wherein the connection lines are coupled to the region input multiplexer outputs through programmable connections.

4. The programmable logic device of claim 1 wherein circuit regions include logic array blocks.

5. The programmable logic device of claim 1 wherein the circuit regions include dedicated blocks.

6. The programmable logic device of claim 1, wherein the first routing line is oriented in a direction that is the same as an orientation direction of the second routing line.

7. The programmable logic device of claim 1, wherein the first routing line is oriented in a direction different than an orientation direction of the second routing line.

8. The programmable logic device of claim 1, wherein the first and second routing lines are longer lines than at least some of the other routing resources.

9. A data processing system comprising the programmable logic device of claim 1.

10. A method of routing signals from a routing resource to a destination routing resource of a programmable logic device, the programmable logic device including circuit regions, the method comprising:
   routing the signals from the routing resource to the destination routing resource through a region input multiplexer;
   routing a second routing line coupled to route signals between the circuit regions, the second routing line including a second driver input multiplexer ("DIM") to select signals for driving the second routing line; and
   providing one or more connection lines coupling respective outputs of one or more of the region input multiplexers to the second DIM.

11. The method of claim 10 wherein the signals are routed to the destination routing resource through an input multiplexer ("DIM") of the second routing resource.

12. The method of claim 10 wherein the destination routing resource is longer than other similarly oriented routing resources in a core of the programmable logic device.

13. The method of claim 10 wherein the region input multiplexer is a logic array block input multiplexer.

14. The method of claim 10 wherein the region input multiplexer is a dedicated block input multiplexer.

15. A programmable logic device comprising:
   core routing means for routing signals between circuit regions;
   circuit region input means for routing signals to a circuit region;
   means for routing signals from one of the core routing means to another through the circuit region input means;
   wherein the core routing means also include a second routing line coupled to route signals between the circuit regions, the second routing line including a second driver input multiplexer ("DIM") to select signals for driving the second routing line; and
   the programmable logic device further comprises one or more connection lines coupling respective outputs of one or more of the region input multiplexers to the second DIM.

16. A programmable logic device comprising:
   circuit regions including sub-regions, the sub-regions including sub-region input multiplexers coupled to select signals for routing to the sub-regions;
   routing resources including routing resources coupled to the sub-region input multiplexers and including a first routing line coupled to route signals between the circuit regions, the first routing line including a first driver input multiplexer ("DIM") to select signals for driving the first routing line;
   wherein the routing resources also include a second routing line coupled to route signals between the circuit regions, the second routing line including a second driver input multiplexer ("DIM") to select signals for driving the second routing line; and the programmable logic device further comprises one or more connection lines coupling respective outputs of one or more of the region input multiplexers to the second DIM; and
   one or more connection lines coupling respective outputs of one or more of the sub-region input multiplexers to the first DIM.

17. The programmable logic device of claim 16 wherein the first routing line is a longer line than at least some of the other routing resources.

18. The programmable logic device of claim 16 wherein the connection lines are coupled to the outputs of the sub-region input multiplexers through programmable connections.

19. The programmable logic device of claim 16 wherein the routing resources are coupled to the sub-region input multiplexers through region input multiplexers.

20. The programmable logic device of claim 19 further comprising one or more connection lines coupling respective outputs of one or more of the region input multiplexers to the first DIM.

21. The programmable logic device of claim 19 wherein:
   the routing resources also include a second routing line coupled to route signals between the circuit regions, the second routing line including a second input multiplexer ("DIM") to select signals for driving the second routing line; and
   the programmable logic device further comprises one or more connection lines coupling respective outputs of one or more of the region input multiplexers to the second DIM.

22. The programmable logic device of claim 16 wherein the regions include logic array blocks and the sub-regions include logic elements.

23. The programmable logic device of claim 16 wherein the regions include dedicated blocks.

24. The programmable logic device of claim 16 wherein the first routing line is oriented in a direction that is the same as an orientation direction of the second routing line.

25. The programmable logic device of claim 16 wherein the first routing line is oriented in a direction different than an orientation direction of the second routing line.

26. The programmable logic device of claim 16 wherein the first and second routing lines are longer lines that at least some of the other routing resources.

27. A data processing system comprising the programmable logic device of claim 16.

28. A method of routing signals from a routing resource to a destination routing resource of a programmable logic device, the programmable logic device including circuit regions and sub-regions, the method comprising:
   routing the signals from the routing resource to the destination routing resource through a sub-region input multiplexer;
   routing a second routing line coupled to route signals between the circuit regions, the second routing line including a second driver input multiplexer ("DIM") to select signals for driving the second routing line; and
   providing one or more connection lines coupling respective outputs of one or more of the region input multiplexers to the second DIM.

29. The method of claim 28 wherein the signals are routed from the routing resource to the sub-region input multiplexer through a region input multiplexer.

30. The method of claim 29 wherein the sub-region input multiplexer is coupled to a secondary signal generator of a logic region of the programmable logic device.

31. The method of claim 28 wherein the signals are routed to the second routing resource through an input multiplexer ("DIM") of the second routing resource.

32. A programmable logic device including circuit regions and sub-regions, the programmable logic device comprising:
  core routing means for routing signals between circuit regions, wherein the core routing means also include a second routing line coupled to route signals between the circuit regions, the second routing line including a second driver input multiplexer ("DIM") to select signals for driving the second routing line; and
  the programmable logic device further comprises one or more connection lines coupling respective outputs of one or more of the region input multiplexers to the second DIM;
  sub-region input means for routing signals to sub-regions; and
  means for routing signals from one of the core routing means to another through the sub-region input means.

33. The programmable logic device of claim 32 further comprising region input means for routing signals to the regions, the region input means being coupled on a signal path between the one of the core routing means and the other of the core routing means.

34. The programmable logic device of claim 32 wherein the region input means is coupled on a signal path between the one of the core routing means and the sub-region input means.

* * * * *